(12) United States Patent
Dyer

(10) Patent No.: US 7,667,255 B2
(45) Date of Patent: Feb. 23, 2010

(54) DEEP TRENCH INTER-WELL ISOLATION STRUCTURE

(75) Inventor: Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 11/748,532

(22) Filed: May 15, 2007

(65) Prior Publication Data

US 2008/0283890 A1    Nov. 20, 2008

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/301; 257/374; 257/E27.092
(58) Field of Classification Search ............... 257/301, 257/374, E27.092, E29.346, 304
See application file for complete search history.

(56) References Cited

U.S. PATENT DOCUMENTS

2007/0090436 A1*   4/2007   Chung ............... 257/301

* cited by examiner

*Primary Examiner*—Hoai v Pham
(74) *Attorney, Agent, or Firm*—Scully, Scott, Murphy & Presser, P.C.; H. Daniel Schnurmann

(57) ABSTRACT

A deep trench is formed in a semiconductor substrate. The deep trench may comprise a pair of parallel substantially vertical sidewalls having a constant separation distance. A set of outer substantially vertical sidewalls may have a closed shape in a horizontal cross-section. At least one dielectric layer is formed in the deep trench. The deep trench is filled with at least one conductive trench fill material to form a conductive deep trench fill region. A shallow trench isolation structure is formed directly on the deep trench to encapsulate the conductive deep trench fill region therebeneath. The stack of the deep trench and the shallow trench isolation structure form a deep trench inter-well isolation structure that provides electrical isolation of devices on one side of the stack from devices on the other side.

9 Claims, 12 Drawing Sheets

DEEP TRENCH INTER-WELL ISOLATION STRUCTURE

FIELD OF THE INVENTION

The present invention relates to a semiconductor structure, and particularly to an intra-well isolation structure comprising a stack of a shallow trench isolation structure and a deep trench, and methods of manufacturing the same.

BACKGROUND OF THE INVENTION

A typical semiconductor device in a complementary metal-oxide-semiconductor (CMOS) circuit is formed in a p-well or an n-well in a semiconductor substrate. Since other semiconductor devices are also present in the semiconductor substrate, the semiconductor device requires electrical isolation from adjacent semiconductor devices. Electrical isolation is provided by isolation structures that employ trenches filled with an insulator material. Electrical isolation of one semiconductor device from other devices located in the same well is called "intra-well isolation." Electrical isolation of the semiconductor device from other devices in an adjacent well of the opposite type is called "inter-well isolation." In both cases, unintended functionality of parasitic devices, such as parasitic pnp or npn bipolar transistors, formed by various elements of the semiconductor device and adjacent semiconductor devices, needs to be suppressed by placing a dielectric material, typically in the form of a trench isolation structure, in the current paths among the elements of the parasitic devices.

Referring to FIG. 1, a vertical cross-sectional view of a prior art trench isolation structure having minimum separation distances between adjacent device regions is shown which includes an inter-well trench isolation structure 4, and two intra-well trench isolation structures (6, 8). The inter-well isolation structure 4 is located at a boundary between a p-well 11 and an n-well 12, and is bounded by a pair of substantially vertical first trench sidewalls 66 and a substantially horizontal first trench bottom surface 67. One intra-well trench isolation structure 6 is located within the p-well 11, and is bounded by a pair of substantially vertical second trench sidewalls 16 and a substantially horizontal second trench bottom surface 17. The other intra-well trench isolation structure 8 is located within the n-well 12, and is bounded by a pair of substantially vertical third trench sidewalls 18 and a substantially horizontal third trench bottom surface 19. The various isolation structures (4, 6, 8) comprise the same dielectric material.

The depths of the inter-well trench isolation structure 4 and the intra-well trench isolation structures (6, 8) are substantially the same. Variations between the depths of the trench isolation structures (4, 6, 8), that is, variations across the heights of inter-well trench sidewalls 66 and intra-well trench sidewalls (16, 18), are typically caused by process bias between trenches having different widths during a reactive ion etch of the trenches. Therefore, the inter-well trench bottom surface 67 and the intra-well trench bottom surface (17, 19) are substantially at the same depth from a top surface of the semiconductor substrate 8.

Both the p-well 11 and the n-well 12 are located above a substrate layer 10', which typically has the same doping level as the original semiconductor substrate prior to the doping of the wells (11, 12). Typically, at least one heavily n-doped region 91, such as source and drain regions of an n-type field effect transistor, is located above the p-well 11, and at least one heavily p-doped region 92, such as source and drain regions of a p-type field effect transistor, is located above the n-well 12. The at least one heavily n-doped region 91, the at least one heavily p-doped region 92, the p-well 11, the n-well 12, the two intra-well trench isolation structures (6, 8), the inter-well trench isolation structure 4, and the substrate layer 10' are located within a semiconductor substrate 8.

An inter-well trench minimum width w1_p of the inter-well trench isolation structure 4 is determined by a combination of the depth of the inter-well trench isolation structure 4 (which is the same as the height of the inter-well trench isolation sidewalls 66), the depths of the at least one heavily n-doped region 91 and the at least on heavily p-doped region 92, the doping levels of the p-well 11 and the n-well 12, the overlay tolerances of lithography processes that are used to form the two wells (11, 12), and the operating voltages of the semiconductor devices abutting the inter-well trench isolation structure 4. An intra-well trench minimum width w2_p of the intra-well trench isolation structures (6, 8) is determined by a combination of the depth of the intra-well trench isolation structure 6, the depth of the at least one heavily n-doped region 91 or the at least one heavily n-doped region 92, the doping level of the p-well 11 or the n-well 12, and the operating voltages of the semiconductor devices abutting the intra-well trench isolation structure 6.

The paths of the weakest inter-well isolation in the prior art isolation structure are represented by a prior art heavily n-doped region to n-well separation distance $d_{2p\_p}$ and a prior art heavily p-doped region to p-well separation distance $d_{2n\_p}$ in FIG. 1. Likewise, the path of the weakest intra-p-well isolation in the prior art isolation structure is represented by a prior art heavily n-doped region to another heavily n-doped region separation distance $d_{1p\_p}$. The path of the weakest intra-n-well isolation in the prior art isolation structure is represented by a prior art heavily p-doped region to another heavily p-doped region separation distance $d_{1n\_p}$. From geometrical considerations, the inter-well trench minimum width w1_p needs to be greater than the intra-well trench minimum width w2_p due to the presence of the boundary between the p-well 11 and the n-well 12 near the middle of the inter-well trench isolation structure 4.

For example, the depths of the at least one heavily n-doped region 91 and the at least one heavily p-doped region 92 may be about 80 nm, the depths of the various trench isolation structures (4, 6) may be about 280 nm, and the overlay tolerance of lithography processes for ion implantation well definition may be about 30 nm. For 1.1V operation of semiconductor devices, this requires the inter-well trench minimum width w1_p to be about 208 nm such that each of the prior art heavily n-doped region to n-well separation distance $d_{2p\_p}$ and the prior art heavily p-doped region to p-well separation distance $d_{2n\_p}$ is at least 289 nm. The prior art heavily n-doped region to another heavily n-doped region separation distance $d_{1p\_p}$ exceeds twice the difference between the depth of the intra-well trench isolation structure 6 and the depth of the heavily n-doped region 91, and consequently exceeds 400 nm. The intra-well trench minimum width w2_p may be limited not by intra-well device isolation considerations, but by process capability considerations to insure filling of the intra-well trench isolation structures 6 with a trench dielectric material. Considerations on the prior art heavily p-doped region to another heavily p-doped region separation distance $d_{1n\_p}$ produces the same result.

Further, the prior art trench isolation structure provides substantially the same depth between the inter-well isolation structure 4 and the intra-well isolation structures (6, 8). Since gap fill characteristics during deposition of dielectric material in a trench depends on the aspect ratio of the trench structure to be filled, a wider trench may have a deeper depth and still be filled. An extended depth would be preferred on an inter-well trench isolation structure having a greater width in this case.

Therefore, there exists a need for an inter-well isolation structure having an increased depth compared to the depth of an intra-well isolation structure having a narrower width and methods of manufacturing the same.

Further, there exists a need for an inter-well trench isolation structure having reduced minimum width compared to the prior art and methods of manufacturing the same.

In addition, there exists a need for such an inter-well trench isolation structure that requires minimal additional processing steps in terms of cost and complexity during the manufacturing.

SUMMARY OF THE INVENTION

The present invention addresses the needs described above by providing an inter-well trench isolation structure comprising a stack of a shallow trench and a deep trench, wherein at least one trench dielectric layer and the shallow trench encapsulates a conductive deep trench fill region in the deep trench.

Specifically, a deep trench is formed in a semiconductor substrate preferably during formation of at least one deep capacitor trench as employed in dynamic random access memory. The deep trench may comprise a pair of parallel substantially vertical sidewalls having a constant separation distance. A set of outer substantially vertical sidewalls may have a closed shape in a horizontal cross-section. At least one dielectric layer, such as a node dielectric layer and a collar dielectric layer, is formed in the at least one deep capacitor trench and the deep trench. The deep trench and the at least one deep capacitor trenches are filled with at least one conductive trench fill material to form a conductive deep trench fill region and at least one conductive capacitor trench fill region. A shallow trench isolation structure is formed directly on the deep trench to encapsulate the conductive deep trench fill region therebeneath. The stack of the deep trench and the shallow trench isolation structure form a deep trench inter-well isolation structure that provides electrical isolation of devices on one side of the stack from devices on the other side.

According to an embodiment of the present invention, a semiconductor structure comprises:
  a. a deep trench located in a semiconductor substrate and containing a pair of parallel substantially vertical sidewalls;
  b. at least one dielectric layer comprising at lest one dielectric material and located directly on the pair of parallel substantially vertical sidewalls;
  c. a shallow trench isolation structure abutting the at least one dielectric layer; and
  d. a conductive deep trench fill region comprising at least one conductive trench fill material, wherein the at least one dielectric layer and the shallow trench isolation structure completely encapsulate the conductive deep trench fill region.

The pair of parallel substantially vertical sidewalls may have a constant separation distance along a horizontal direction that is perpendicular to a surface normal of the pair of parallel substantially vertical sidewalls.

The semiconductor structure may further comprise at least one trench capacitor, each of the at least one trench capacitor comprising:
  a. a deep capacitor trench located in the semiconductor substrate and having a substantially elliptical horizontal cross-sectional area;
  b. a buried plate region located directly on the deep capacitor trench;
  c. another at least one dielectric layer comprising the at least one dielectric material and located directly on the deep capacitor trench; and
  d. another conductive trench fill material region comprising the conductive trench fill material, wherein an electrically conductive path is present between the another conductive trench fill material region and a portion of the semiconductor substrate outside the deep capacitor trench.

The semiconductor structure may further comprise:
  a. a p-well abutting one of the pair of parallel substantially vertical sidewalls and the shallow trench isolation structure; and
  b. an n-well abutting the other of the pair of parallel substantially vertical sidewalls and the shallow trench isolation structure and disjoined from the p-well.

The semiconductor structure may further comprise:
  a. at least one heavily n-doped region abutting the p-well, a top surface of the semiconductor substrate, and one side of the shallow trench isolation structure; and
  b. at least one heavily p-doped region abutting the n-well, the top surface, and the other of the shallow trench isolation structure, wherein each of the at least one heavily n-doped region and the at least one heavily p-doped region has a dopant concentration in the range from about $5.0 \times 10^{19}$ atoms/cm$^3$ to about $5.0 \times 10^{21}$ atoms/cm$^3$.

The at least one dielectric layer may consist of:
  a. a node dielectric layer comprising a node dielectric material; and
  b. a trench collar dielectric layer comprising a trench collar dielectric material, wherein the trench collar dielectric layer abuts the shallow trench isolation structure.

Alternatively, the at least one dielectric layer may consist of a node dielectric layer comprising a node dielectric material.

The p-well and the n-well may abut a U-shaped buried plate region located directly on the deep trench.

At least one trench capacitor may be located in a p-well and said a buried plate region may be doped with n-type dopants.

According to another embodiment of the present invention, a semiconductor structure comprises:
  a. a deep trench located in a semiconductor substrate and containing a set of outer substantially vertical sidewalls and having a depth in the range from about 2 micron to about 8 micron;
  b. at least one dielectric layer comprising at least one dielectric material and located directly on the set of outer substantially vertical sidewalls;
  c. a shallow trench isolation structure abutting the at least one dielectric layer; and
  d. a conductive deep trench fill region comprising at least one conductive trench fill material, wherein the at least one dielectric layer and the shallow trench isolation structure completely encapsulate the conductive deep trench fill region and the set of outer substantially vertical sidewalls has a closed shape in a horizontal cross-section of the semiconductor structure across the deep trench.

The conductive deep trench fill region may have a solid form without a void, i.e., topologically homeomorphic to a sphere.

Alternatively, the semiconductor structure may further comprise at least one set of inner substantially vertical sidewalls located on the at least one dielectric layer, wherein each of the at least one set of inner substantially vertical sidewalls has a closed shape in a horizontal cross-section of the semiconductor structure across the deep trench and the conductive deep trench fill region has a void around each of the at least one set of inner substantially vertical sidewalls, i.e., topologically has as many number of handles as the number of the at least one set.

According to the present invention, a method of forming a semiconductor structure comprises:

a. forming a deep trench in a semiconductor substrate;
b. forming at least one dielectric layer comprising at least one dielectric material directly on a pair of parallel substantially vertical sidewalls and at least one deep capacitor trench;
c. filling the deep trench with at least one conductive trench fill material and forming a conductive deep trench fill region out of the at least one conductive trench fill material; and
d. forming a shallow trench isolation structure abutting the at least one dielectric layer and the deep trench, wherein the at least one dielectric layer and the shallow trench isolation structure completely encapsulate at least one conductive trench fill material abutting the shallow trench isolation structure.

The method may further comprise forming a U-shaped buried plate region located directly on the deep trench, wherein the U-shaped buried plate region has substantially the same doping concentration as the at least one buried plate region, and is confined between the first depth and the second depth.

The method may further comprise:

a. forming a p-well abutting one of the pair of parallel substantially vertical sidewalls and the shallow trench isolation structure; and
b. forming an n-well abutting the other of the pair of parallel substantially vertical sidewalls and the shallow trench isolation structure and disjoined from the p-well.

DETAILED DESCRIPTION OF THE INVENTION

Figure 1:
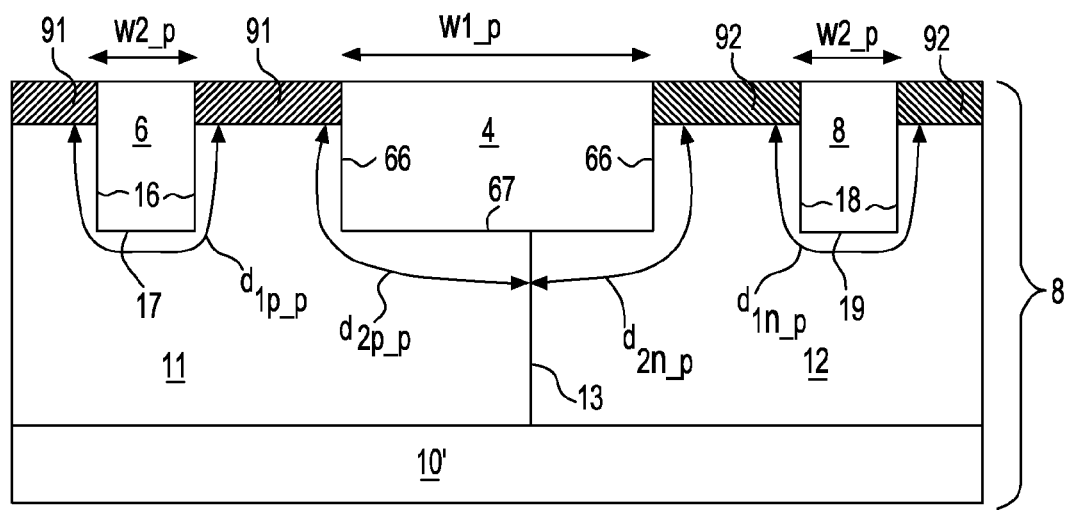
FIG. 1 is a vertical cross-sectional view of a prior art trench isolation structure.

As stated above, the present invention relates to an interwell trench isolation structure comprising a stack of a shallow trench and a deep trench, wherein at least one trench dielectric layer and the shallow trench encapsulates a conductive deep trench fill region in the deep trench, and methods of manufacturing the same, which are now described in detail with accompanying figures. It is noted that like and corresponding elements are referred to by like reference numerals.

Figure 2A:
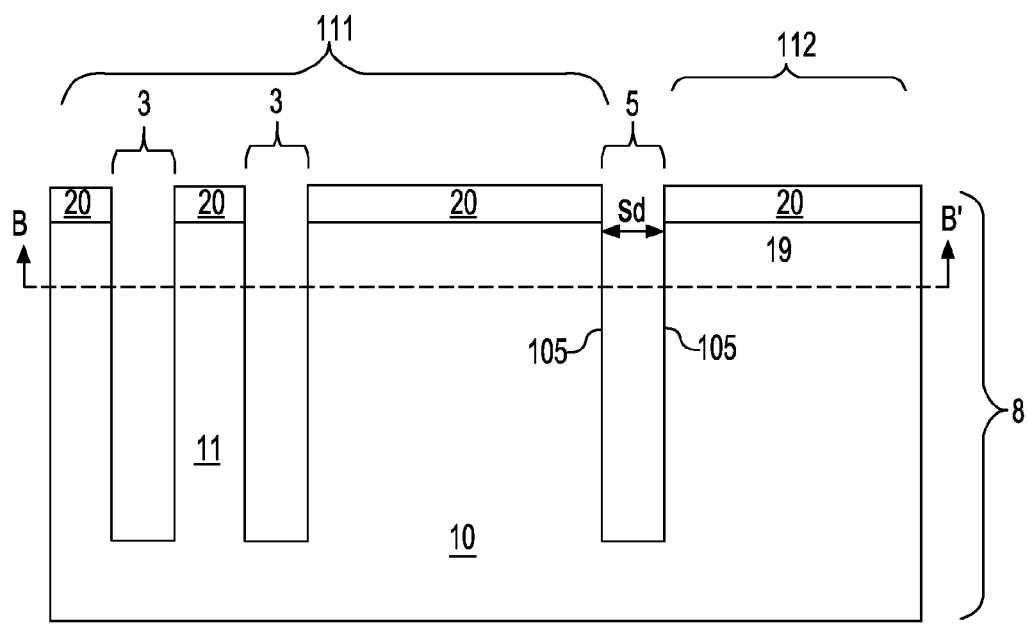
FIGS. 2A-12B are sequential views of a first exemplary semiconductor structure according to a first embodiment of the present invention at various stages of a manufacturing sequence. Figures labeled with the same figure numeral correspond to the same stage of the manufacturing sequence. Figures labeled with the suffix, "A" are vertical cross-sectional views along the vertical plane A-A' in the figure with the same figure numeral and the suffix, "B." Figures labeled with the suffix, "B" are horizontal cross-sectional views along the plane B-B' in the figure with the same figure numeral and the suffix, "A." Figures without a suffix are vertical cross-sectional views along the vertical plane corresponding to the vertical plane A-A' in the previous figure with the suffix, "B."
Figure 2B:
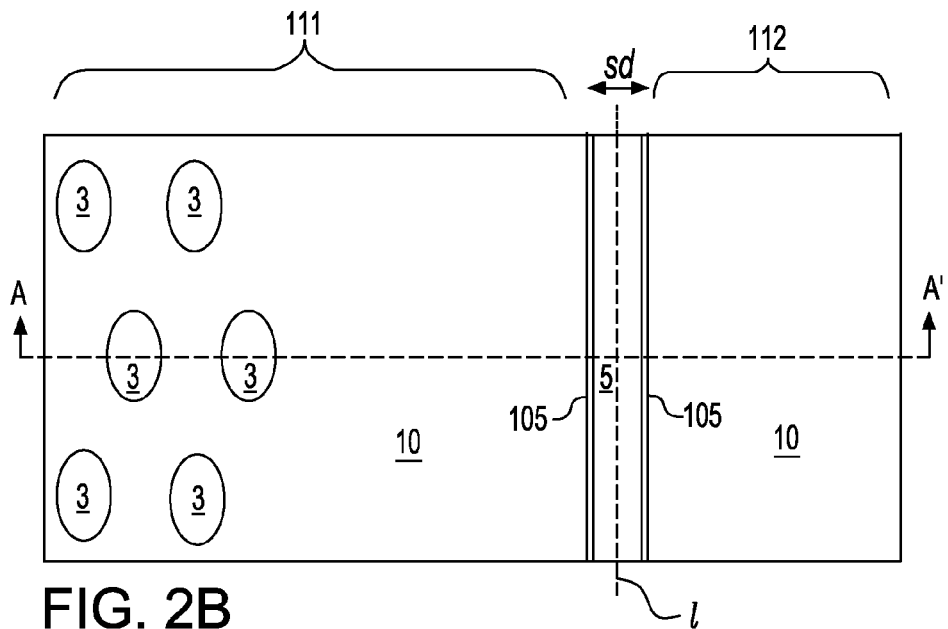

Referring to FIG. 2A and 2B, a first exemplary semiconductor structure comprises a semiconductor substrate 8 containing a substrate layer 10, and at least one pad layer 20 formed thereupon. The substrate layer 10 may comprise silicon, silicon-carbon alloy, silicon germanium alloy, silicon-carbon-germanium alloy, GaAs, InAs, InP, other III-V compound semiconductors, or II-VI compound semiconductors. The substrate layer 10 may be p-doped or n-doped, i.e., may have more of p-type dopants than n-type dopants or vice versa. The substrate layer 10 has a dopant concentration in the range from about $1.0 \times 10^{15}$ atoms/cm$^3$ to about $1.0 \times 10^{18}$ atoms/cm$^3$. Portions of substrate layer 10 may be removed or implanted with dopants to form another element of the structure during subsequent processing steps, in which case the substrate layer 10 therein refers to the remaining portion having the same dopant concentration as the original substrate layer 10 in FIG. 2A.

In a preferred version of the first embodiment, the substrate layer 10 comprises p-doped single crystalline silicon having a doping concentration in the range from about $1.0 \times 10^{15}$ atoms/cm$^3$ to about $1.0 \times 10^{17}$ atoms/cm$^3$.

The at least one pad layer 20 is formed on a top surface 19 of the substrate layer 10. The at least one pad layer 20 typically serves as a hard mask during a reactive ion etch of the substrate layer 10 in a subsequent process. The at least one pad layer 20 may comprise an oxide, nitride, oxynitride, or a stack thereof. The thickness of the at least one pad layer 20 is typically in the range from about 200 nm to about 1,000 nm. For example, the at least one pad layer may comprise a first silicon oxide layer having a thickness of about 20 nm, a silicon nitride layer having a thickness of about 200 nm, and a second oxide layer having a thickness of about 600 nm.

A photoresist (not shown) is applied over the at least one pad layer 20 and lithographically patterned. The pattern is transferred into the at least one pad layer 20 and into the substrate layer 10 to form a deep trench 5 and preferably at least one deep capacitor trench 3 in the semiconductor substrate 8. Each of the at least one deep capacitor trench 3 is employed to form a deep trench capacitor in a dynamic random access memory (DRAM) device or in an embedded dynamic random access memory (eDRAM) device. Consequently, the shapes of horizontal cross-sectional area of the at least one deep capacitor trench 3 are a substantially elliptical. The lateral dimensions of the at least one deep trench capacitor 3 are typically in the range from about 100 nm to about 300 nm. The depth of the at least one deep trench capacitor 3 is in the range from about 2 microns to about 8 microns, and typically in the range from about 3 micros to about 6 microns. The trench sidewalls of the at least one deep trench capacitor 3 are substantially vertical but may have a small taper angle in the vertical direction, typically within 3 degrees. The trench bottom surface of the at least one deep trench capacitor 3 may be rounded.

The deep trench 5 may be a line trench formed along a line 1 in the semiconductor substrate 8. The sidewall surfaces of the deep trench 5 forms a pair of parallel substantially vertical sidewalls 105. Each of the parallel substantially vertical sidewalls 105 are substantially vertical but may have a small taper angle in the vertical direction, typically within 3 degrees, as in the case of the at least one deep trench capacitor 3. Each of the parallel substantially vertical sidewalls 105 may be planar, that is, not curved having a radius of curvature of infinity. In the case of a line trench, the pair of parallel substantially vertical sidewalls 105 are separated by a constant separation distance sd along the line 1, which is a horizontal direction that is perpendicular to a surface normal of the pair of parallel substantially vertical sidewalls 105. In the cross-sectional view in FIG. 2B, the two lines representing the pair of parallel substantially vertical sidewalls 105 are separated by a constant separation distance sd in the direction perpendicular to the direction of the two lines.

The deep trench 5 divides the area of the semiconductor substrate as seen from above into two portions, a p-well area 111 and an n-well area 112. Typically, the at least one deep capacitor trench 3 is formed within the p-well area 111. The p-well area 111 adjoins one of the pair of parallel substantially vertical sidewalls 105 and the n-well area 112 adjoins the other of the pair of substantially vertical and planar sidewalls 105.

Figure 3A:
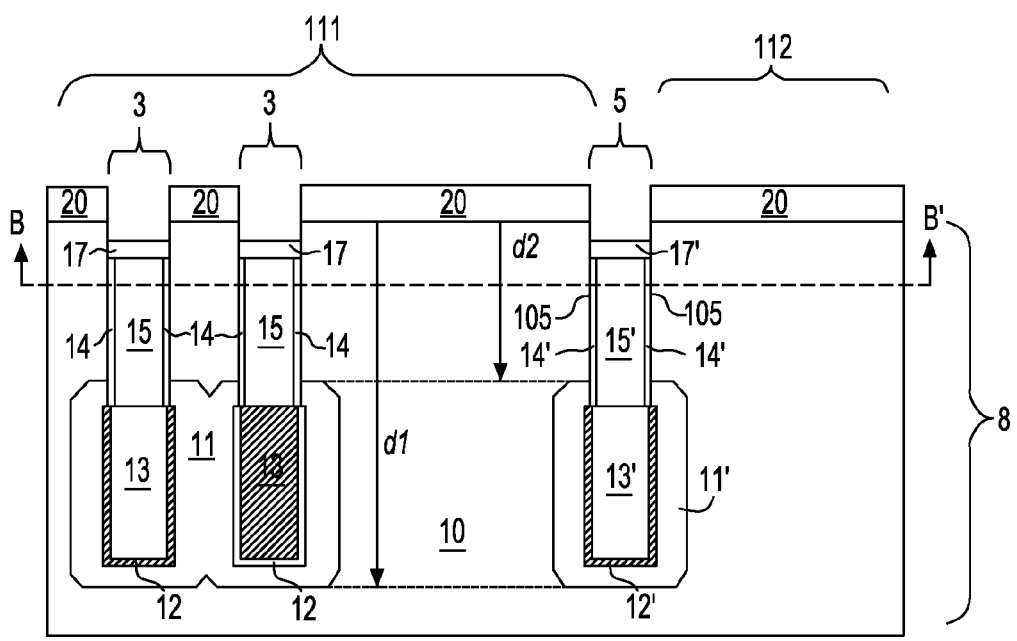
Figure 3B:
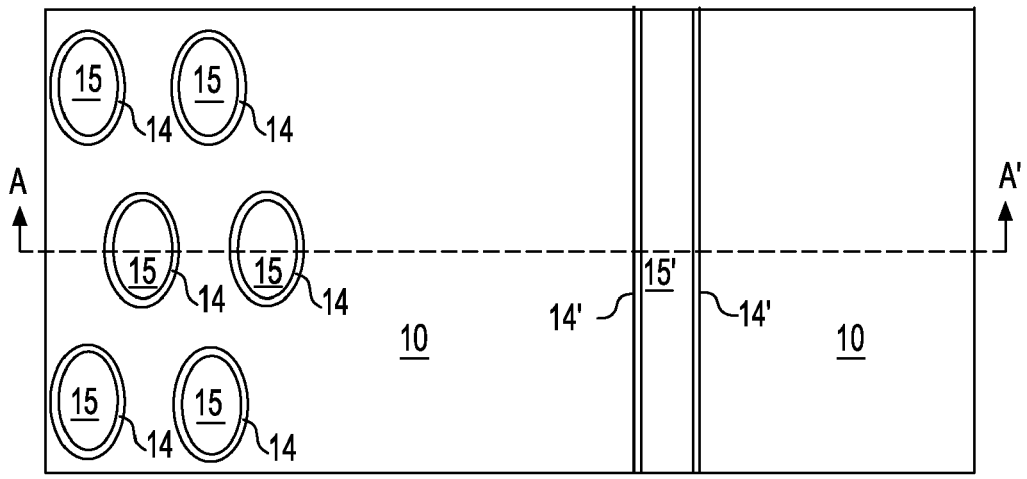

Referring to FIGS. 3A and 3B, a buried plate region 11 is formed on and outside of each of the at least one deep capacitor trench 3. In the case of multiple deep capacitor trenches 3, the buried plate region 11 comprises a merged volume of the smaller buried plate regions on an individual deep capacitor trench 3. The buried plate region 11 is formed by employing methods well known in the art, such as a combination of an arseno-silicate glass (ASG) deposition, photoresist fill and recess, removal of an upper portion of the deposited ASG, removal of the photoresist, a drive-in anneal, and removal of the remaining ASG. Alternative methods of doping the substrate layer 10 to form the buried plate region 11, such as gas phase doping or plasma doping, are also known in the art.

The bottom surface of the buried plate region 11 is located at a first depth d1, which has a range from about 2 microns to about 9 microns. The top surface of the buried pate region 11 is located at a second depth d2, which has a range from about 0.5 micron to about 2 microns. The at least one buried plate region 11 has a doping concentration from about $3.0\times10^{18}/cm^3$ to about $1.0\times10^{20}/cm^3$. The at least one buried plate region 11 may be p-doped or n-doped. Preferably, the at least one buried plate region 11 is n-doped.

Concurrently with the formation of the buried plate region 11 on the at least one deep capacitor trench 3, a U-shaped buried plate region 11' is formed directly on the deep trench 5. The U-shaped buried plate region 11' has substantially the same doping concentration as the at least one buried plate region 11. The U-shaped buried plate region 11' has a substantially constant cross-sectional area along the direction of the line l, i.e., in the direction perpendicular to the plane A-A' in FIG. 3B. The U-shaped buried plate region 11' is confined between the first depth d1 and the second depth d2.

At least one dielectric layer is formed directly on the at least one deep capacitor trench 3. Each of the at least one dielectric layer comprises at lest one dielectric material. The at least one dielectric layer may consist of a portion of a node dielectric layer 12 comprising a node dielectric material and a trench collar dielectric layer 14 comprising a trench collar dielectric material. Methods of forming the at least one dielectric layer (12, 14) are well known in the art. Concurrently with the formation of the at least one dielectric layer (12, 14) on the at least one deep capacitor trench 3, at least another dielectric layer having the same composition is formed on the deep trench 5. Specifically, during the same processing step in which the portion of the node dielectric layer 12 is formed on the at least one deep capacitor trench 3, another portion of the node dielectric layer 12' is formed directly on the pair of parallel substantially vertical sidewalls 105. Also, during the same processing step in which a portion the trench collar dielectric layer 14 is formed on the at least one deep capacitor trench 3, another portion of the trench collar dielectric layer 14' is formed directly on the pair of parallel substantially vertical sidewalls 105. Thus, the at least another dielectric layer (12', 14') may consist of the another portion of the node dielectric layer 12' comprising the node dielectric material and the another portion of the trench collar dielectric layer 14' comprising the trench collar dielectric material. For example, the node dielectric layer (12, 12') may comprise a nitride layer having a thickness from about 3 nm to about 8 nm, and the trench collar dielectric layer (14, 14') may comprise a silicon oxide having a thickness from about 10 nm to about 50 nm.

A conductive capacitor trench fill region comprising at least one conductive trench fill material is formed directly within each of the at least one deep capacitor trench 3. The conductive capacitor trench fill region may comprise multiple portions, for example, a first conductive trench fill subregion 13, a second trench fill region 15, and a third trench fill region 17. The multiple portions of the conductive capacitor trench fill region (13, 15, 17) are formed at different processing steps, and typically interspersed between the processing steps for the formation of the various portions of the at least one dielectric layer (12, 14). Each portion of the conductive capacitor trench fill region may comprise the same, or different, conductive trench fill material. The conductive trench fill material may comprise a doped semiconductor material, an elemental metal, and/or a metal alloy. The doped semiconductor may be selected from doped amorphous silicon, doped amorphous silicon containing alloy, doped polysilicon, and doped polycrystalline silicon alloy. The elemental metal may be selected from Ta, Ti, W, and other elemental metals. The metal alloy may be selected from a metal silicide, metal germanide, conductive metal nitride, and a combination thereof. A commonly used conductive trench fill material is a heavily doped polysilicon. Methods of forming the conductive capacitor trench fill region (13, 15, 17) are well known in the art.

Concurrently with the formation of the conductive capacitor trench fill region (13, 15, 17) on the at least one deep capacitor trench 3, a conductive deep trench fill region having the same composition is formed on the deep trench 5. In case a conductive capacitor trench fill region (13, 15, 17) within the at least one deep capacitor trench 3 comprises multiple portions, the conductive deep trench fill region comprises the same number of multiple portions, each of which is formed at the same processing step corresponding to the counterpart in the conductive capacitor trench fill region (13, 15, 17). Specifically, during the same processing step in which the first conductive trench fill subregion 13 is formed within the at least one deep capacitor trench 3, a first conductive deep trench fill subregion 13' is formed within the deep trench 5. During the same processing step in which the second conductive trench fill subregion 15 is formed within the at least one deep capacitor trench 3, a second conductive deep trench fill subregion 15' is formed within the deep trench 5. During the same processing step in which the third conductive trench fill subregion 17 is formed within the at least one deep capacitor trench 3, a third conductive deep trench fill subregion 17' is formed within the deep trench 5.

At the end of forming the conductive capacitor trench fill region (13, 15, 17) in the at least one deep capacitor trench 3, an electrically conductive path is present between the conductive capacitor trench fill region (13, 15, 17) inside each of the at least one deep capacitor trench 3 and the semiconductor layer 10, which is the portion of the semiconductor substrate 8 outside the at least one deep capacitor trench 3 and the deep trench 5. Specifically, in FIG. 3A, the third conductive trench fill subregion provides the electrically conductive path is between the conductive capacitor trench fill region (13, 15, 17) and the semiconductor layer 10. Likewise, the third conductive deep trench fill subregion 17' provides an electrically conductive path between the conductive deep trench fill region (13', 15' 17') of the deep trench 5 and the semiconductor layer 10. Further, the third conductive deep trench fill subregion 17' provides electrical contact between the two portions of the substrate layer 10 across the deep trench 5, i.e., between the p-well area 111 and the n-well area 112.

Figure 4:
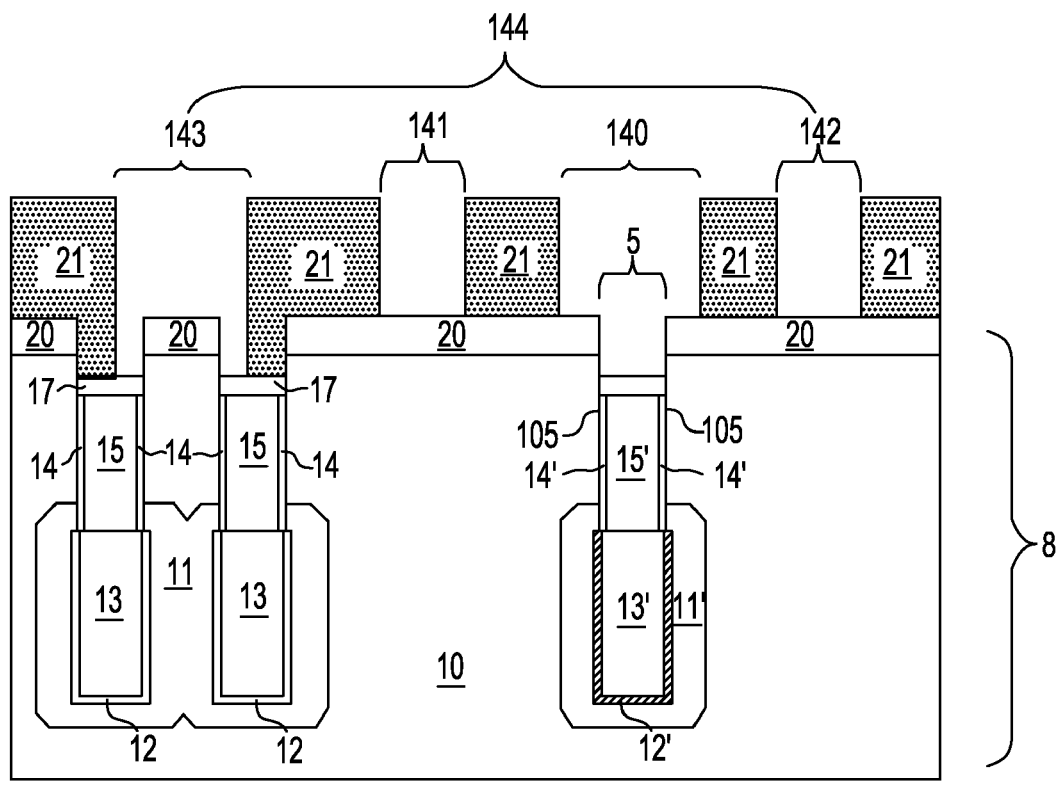

Referring to FIG. 4, a first photoresist 21 is applied over the semiconductor substrate 8 and lithographically patterned so that the first photoresist 21 is removed from over a shallow trench isolation area 144. The shallow trench isolation area 144 comprises a first shallow trench isolation area 140 over the deep trench 5 which includes the entirety of the cross-sectional area of the deep trench 5. Typically, the shallow trench isolation area 140 further comprises an array shallow trench isolation area 143 including a fraction of the cross-sectional area of each of the at least one deep capacitor trench 5 (See FIGS. 2B and 3B), an optional intra-p-well shallow trench isolation area 141, and an optional intra-n-well shallow trench isolation area 142.

Figure 5:
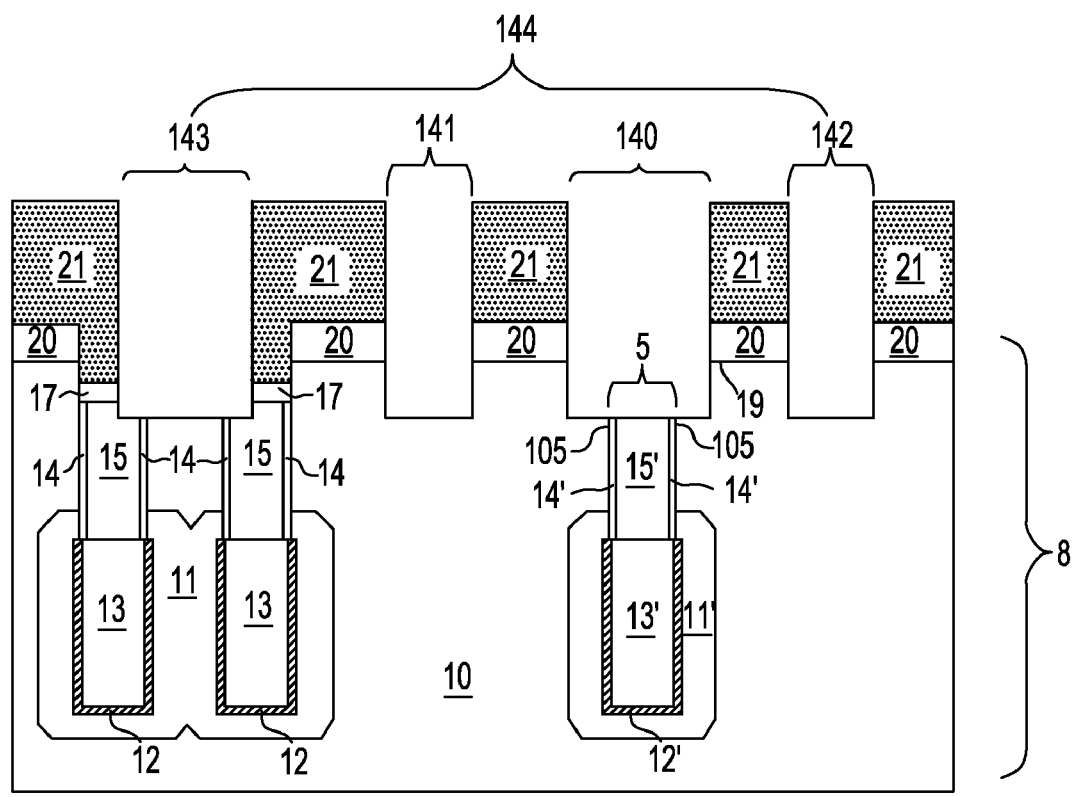

Referring to FIG. 5, the portion of the at least one pad layer 20 and the substrate layer 10 within the shallow trench area 144 are etched by a reactive ion etch. Various shallow trenches are formed within the shallow trench isolation area 144. The depth of the reactive ion etch extends from the top surface 19 at least to the top of the at least one dielectric layer (12, 14) and the at least another dielectric layer (12', 14'). Specifically, the depth of the reactive ion etch extends at least to the top of the trench collar dielectric layer 12 in the at least one deep capacitor trench 3 and another portion of the trench collar dielectric layer 12' in the deep trench 5. Consequently, the third conductive deep trench fill subregion 17' is removed from above the deep trench 5. However, the remaining third conductive trench fill subregion 17 within the at least one deep capacitor trench 3 provides an electrically conductive path from the conductive capacitor trench fill region (13, 15, 17) within each of the at least one deep capacitor trench 3 to the substrate layer 10.

Figure 6:
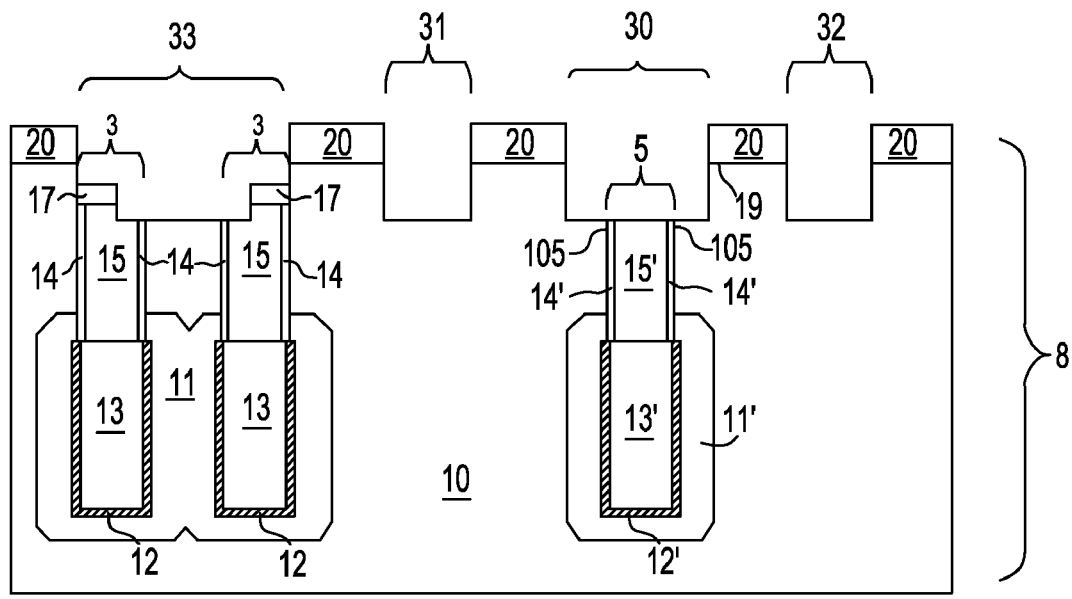

Referring to FIG. 6, the first photoresist is removed. An inter-well shallow trench 30 having a bottom surface abutting the another portion of the trench collar dielectric layer 14' is formed over the deep trench 5. An array shallow trench 33 having a bottom surface abutting the trench collar dielectric layer 14 is formed over the at least one deep capacitor trench 3. An optional intra-p-well shallow trench 31 may be formed in the optional intra-p-well shallow trench isolation area 141, and an optional intra-n-well shallow trench 32 may be formed in an optional intra-n-well shallow trench isolation area 142.

The depths of the bottom surfaces of the various shallow trenches (30, 31, 32, 33) are substantially the same and in the range from about 150 nm to about 500 nm, and typically in the range from about 200 nm to about 360 nm. The sidewalls of the various shallow trenches (30, 31, 32, 33) are substantially vertical, and have an angle from about 80 degrees to about 100 degrees relative to the top surface 19.

Figure 7:
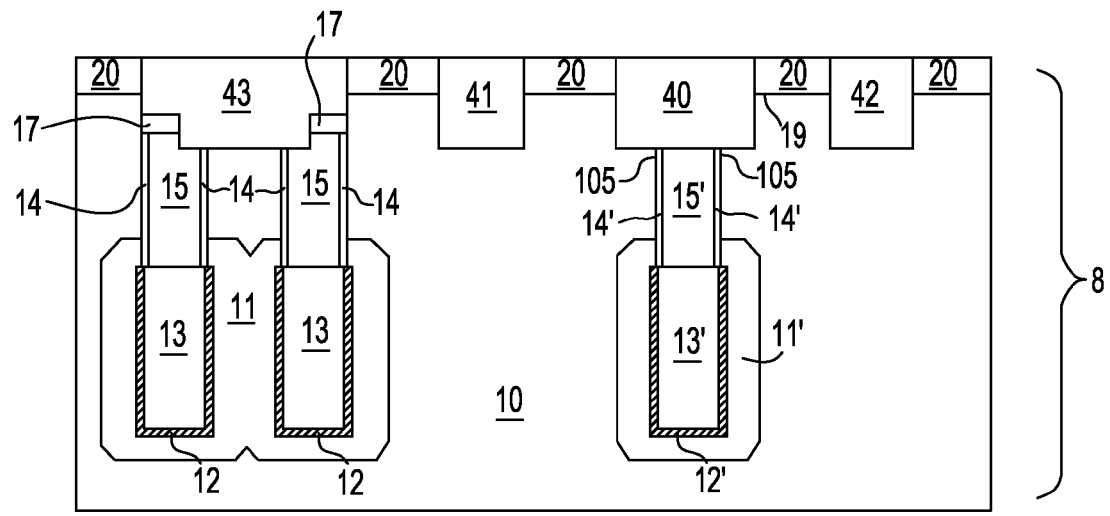

Referring to FIG. 7, various shallow trench isolation structures are formed with the various shallow trenches (30, 31, 32, 33) by depositing and planarizing a shallow trench dielectric material. The shallow trench dielectric material may comprise an oxide, a nitride, an oxynitride, or a combination thereof. For example, the shallow trench dielectric material may comprise silicon oxide. For planarization, a chemical mechanical planarization (CMP) process may be used employing the at least one pad layer 20 as a stopping layer. An intra-well shallow trench isolation structure 40 is formed in the inter-well shallow trench 30. An array shallow trench isolation structure 43 is formed in the array shallow trench 33. An optional intra-p-well shallow trench isolation structure 41 may be formed in the optional intra-p-well shallow trench 31, and an optional intra-n-well shallow trench isolation structure 42 may be formed in the optional intra-n-well shallow trench 32.

The inter-well shallow trench isolation structure 40 and the at least another dielectric layer (12', 14'), which consists of the another portion of the node dielectric layer 12' and the another portion of the trench collar dielectric layer 14', completely encapsulates the remaining conductive deep trench fill region (13', 15') comprising the first conductive deep trench fill subregion 13' and the second conductive deep trench fill subregion 15'. Therefore, there is no electrical conductive path from the remaining conductive deep trench fill region (13', 15') to any portion of the semiconductor substrate 8 outside the deep trench 5. However, the third conductive trench fill subregion 17 in each of the at least one deep capacitor trench 3 provides an electrically conductive path between the conductive capacitor trench fill region (13, 15, 35, 17) inside the at least one deep capacitor trench 3 and the semiconductor substrate 8 outside the deep trench 5.

Figure 8:
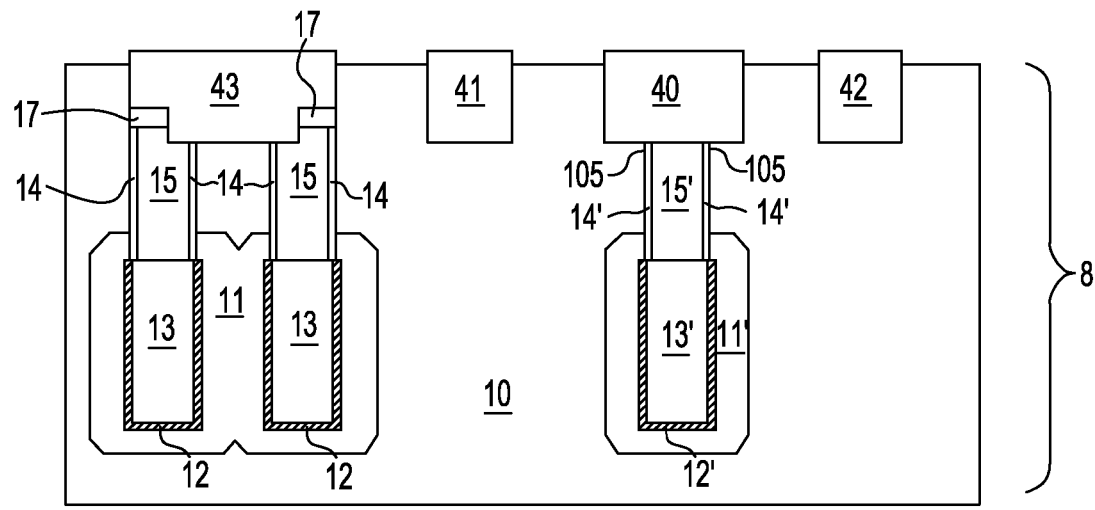

Referring to FIG. 8, the various shallow trench isolation structures (40, 41, 42, 43) are recessed, for example, by a wet etch or by another reactive ion etch. The at least one pad layer 20 is thereafter removed. The top surfaces of the various shallow trench isolation structures (40, 41, 42, 43) may be higher than, level with, or lower than the top surface 19 of the substrate layer. Preferably, the top surfaces of the various shallow trench isolation structures (40, 41, 42, 43) is higher than the top surface 19 of the substrate layer by a height differential from zero to about 30 nm so that subsequent etch of the various shallow trench isolation structures (40, 41, 42, 43) brings the height differential close to zero.

Figure 9:
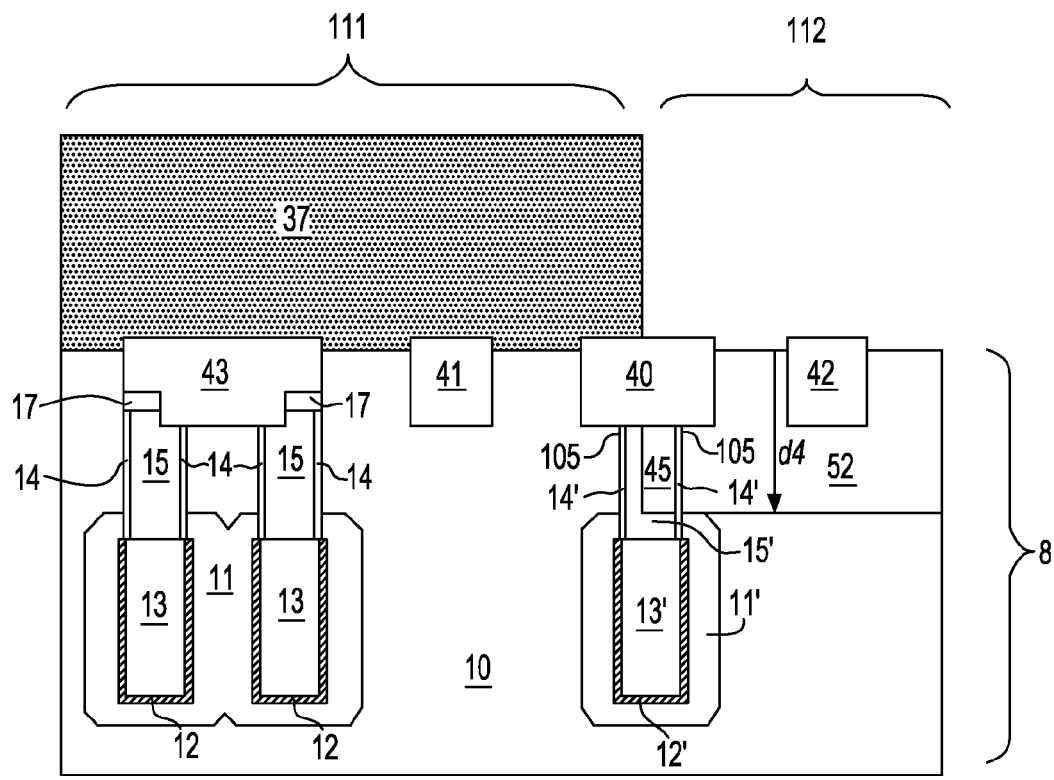

Referring to FIG. 9, a second photoresist 37 is applied to the top surface of the semiconductor substrate 8 and lithographically patterned to expose the n-well area 112 while covering the p-well area 111. The edge of the patterned second photoresist 37 is located preferably between the pair of parallel substantially vertical sidewalls 105. N-type dopants are implanted into the substrate layer 10 to form an n-well 52 in the semiconductor substrate 8 within the n-well area 112. The n-type dopants are also implanted into the second conductive deep trench fill subregion 15' to form a first modified doping level conductive capacitor trench fill region 45, which comprises the material of the second conductive deep trench fill subregion 15' and contains the dopants of the n-well 52 as well. The n-type dopants may be selected from P, As, Sb, and a combination thereof. Typically, the n-well 52 has a dopant concentration from about $5.0 \times 10^{16}$ atoms/cm$^3$ to about $5.0 \times 10^{19}$ atoms/cm$^3$. The depth d4 of the n-well 52, or the "fourth depth," as measured from the top surface 19 of the semiconductor substrate 8 to the bottom surface of the n-well 52, is typically from about 200 nm to about 1,200 nm, and preferably from 300 nm to about 1,000 nm. The second photoresist 37 is subsequently removed and the surfaces of the structure may be cleaned as needed.

Figure 10:
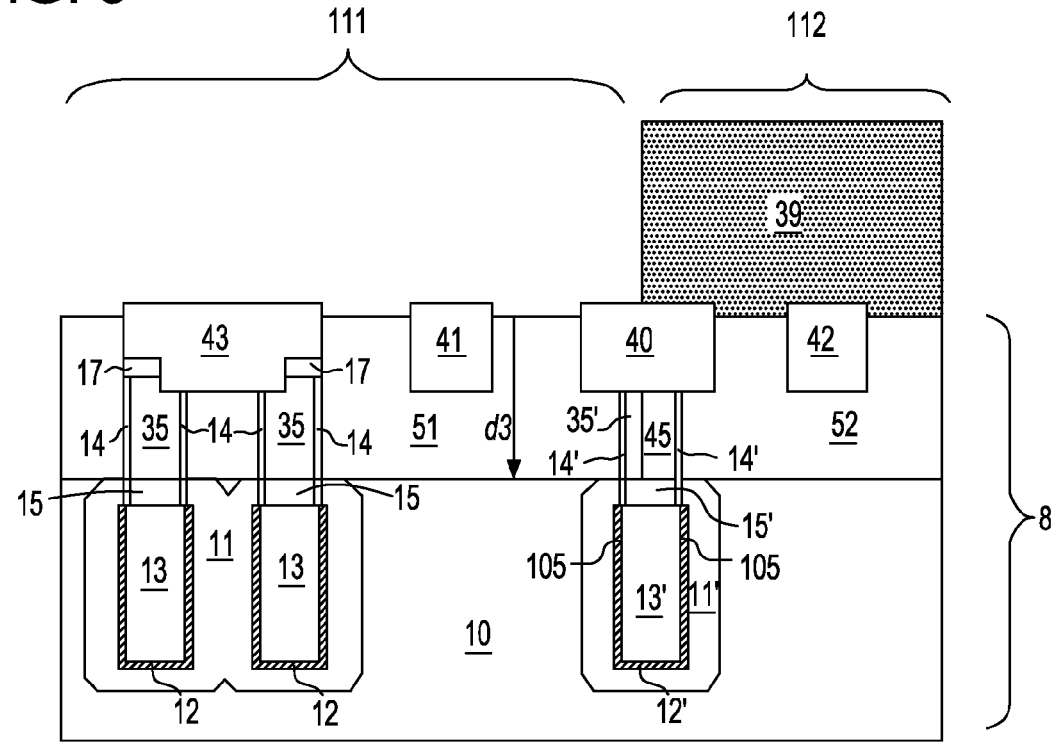

Referring to FIG. 10, a third photoresist 39 is applied to the top surface of the semiconductor substrate 8 and lithographically patterned to expose the p-well area 111 while covering the n-well area 112. The edge of the patterned third photoresist 39 is located preferably between the pair of parallel substantially vertical sidewalls 105. P-type dopants are implanted into the substrate layer 10 to form a p-well 51 in the semiconductor substrate 8 within the p-well area 111. The p-type dopants are also implanted into the second conductive trench fill subregion 15 to form a second modified doping level conductive capacitor trench fill region 35. The p-type dopants are implanted into the second conductive deep trench fill subregion 15' to form a third modified doping level conductive trench fill region 35'. The second and third modified doping level conductive trench fill regions (35, 35') comprise the same material as the original second conductive trench fill subregion 15 or the original second conductive deep trench fill subregion 15' and contains the dopants of the p-well 51 as well. The p-type dopants may be selected from B, Ga, In and a combination thereof. Typically, the p-well 52 has a dopant concentration from about $5.0 \times 10^{16}$ atoms/cm$^3$ to about $5.0 \times 10^{19}$ atoms/cm$^3$. The depth d3 of the p-well 51, or the "third depth," as measured from the top surface 19 of the semiconductor substrate 8 to the bottom surface of the p-well 51, is typically from about 200 nm to about 1,800 nm, and preferably from about 300 nm to about 1,000 nm.

Figure 11:
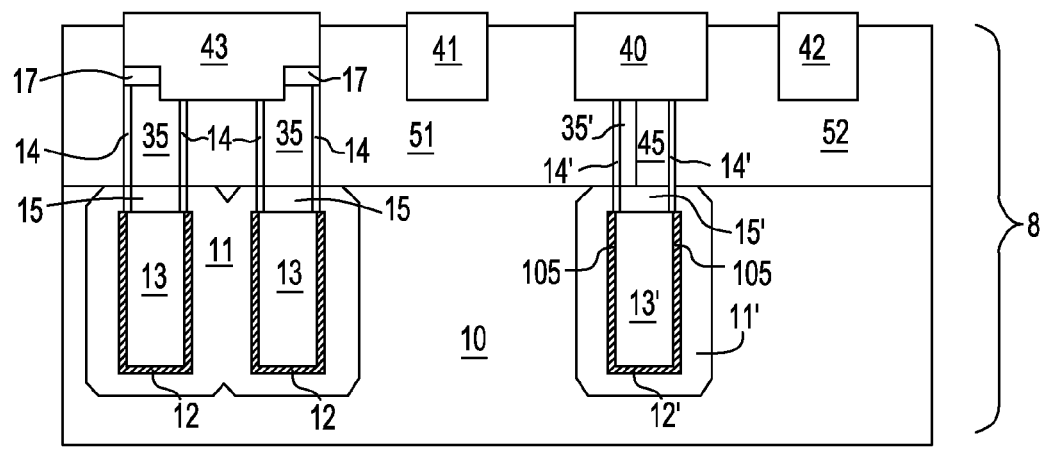

Referring to FIG. 11, the third photoresist 39 is subsequently removed and the surfaces of the structure may be cleaned as needed.

Figure 12A:
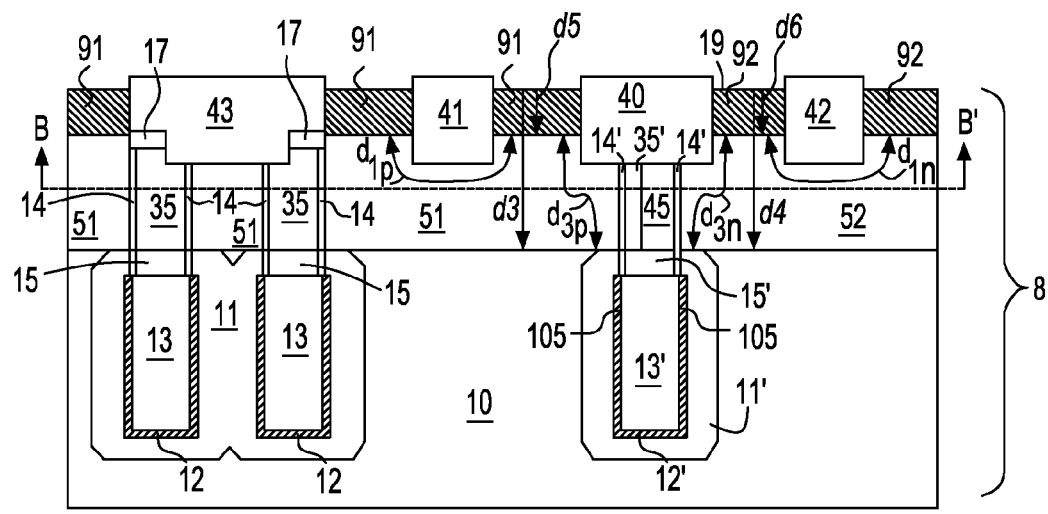
Figure 12B:
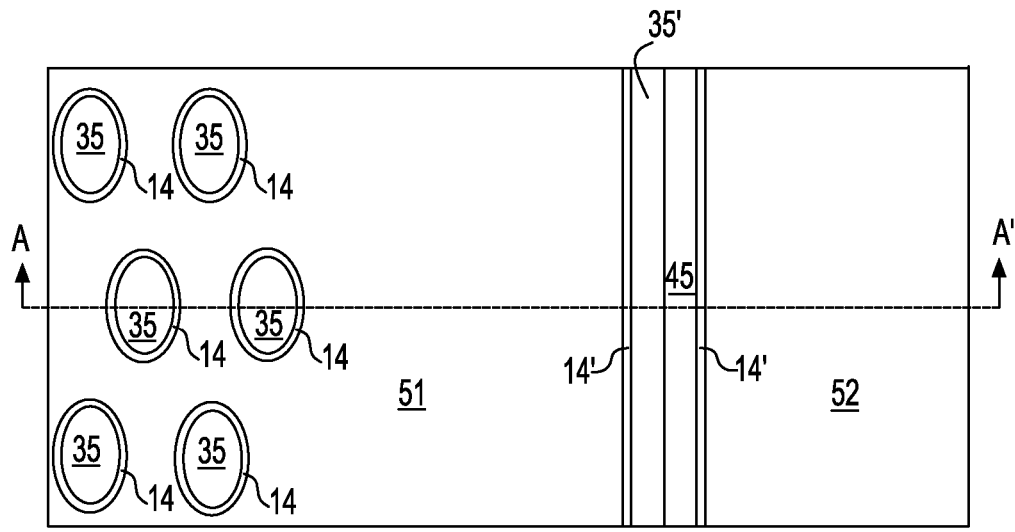

Referring to FIGS. 12A and 12B, a heavily n-doped region 91 and a heavily p-doped region 92 are formed by employing block masks (not shown) and ion implantation processes in a manner similar to the formation of the p-well 51 and the n-well 52. The heavily n-doped region 91 has a depth d5, or a "fifth depth," from about 50 nm to about 300 nm, and preferably from about 80 nm to about 200 nm. The heavily p-doped region 92 has a depth d6, or a "sixth depth," from about 50 nm to about 300 nm, and preferably from about 80 nm to about 200 nm. The heavily n-doped region 91 and the heavily p-doped region 92 abut the top surface 19 of the semiconductor substrate 8 and may abut the sidewalls of the various shallow trench isolation structures (40, 41, 42, 43). Each of the at least one heavily n-doped region 91 and the at least one heavily p-doped region 92 has a dopant concentration from about $5.0 \times 10^{19}$ atoms/cm$^3$ to about $5.0 \times 10^{21}$ atoms/cm$^3$. The heavily doped regions (91, 92) may be source and drain regions of field effect transistors. Typically, portions of the at least one heavily n-doped region 91 comprise a source region of a transistor that controls the flow of charge into or out of the at least one deep capacitor trench 3, within each of which components of a deep trench capacitor are located. The third conductive trench fill subregion 17 is typically called a "buried strap" and provides an electrically conductive path from inside a deep trench capacitor to the source of a transistor.

The optional intra-p-well shallow trench isolation structure 41 may provide intra-p-well isolation within the p-well 51. The path of the weakest intra-p-well isolation is represented by a heavily n-doped region to another heavily n-doped region separation distance $d_{1p}$ underneath and around the optional intra-p-well shallow trench isolation structure 41. Similarly, the optional intra-n-well shallow trench isolation structure 42 may provide intra-n-well isolation within the n-well 52. The path of the weakest intra-n-well isolation is represented by a heavily p-doped region to another heavily p-doped region separation distance $d_{1n}$ underneath and around the optional intra-n-well shallow trench isolation structure 42.

The paths of the weakest inter-well isolation are at least as long as a heavily n-doped region to substrate layer separation distance $d_{3p}$ or a heavily p-doped region to substrate layer separation distance $d_{3n}$. The heavily n-doped region to substrate layer separation distance $d_{3p}$ is the same the third depth d3 less the depth of the at least one heavily n-doped region 91. The heavily p-doped region to substrate layer separation distance $d_{3p}$ is at least as long as the third depth d3 less the fifth depth d5. The heavily n-doped region to substrate layer separation distance $d_{3n}$ is at least as long as the fourth depth d4 less the sixth depth d6. The paths of the weakest inter-well isolation is longer than the above lower limit estimates since additional distances, such as a horizontal jog underneath the inter-well shallow trench isolation structure 40, are present in the path.

Thus, the present invention provides a structure having a stack of an inter-well shallow trench isolation structure 40 and a deep trench 5, which provides an inter-well isolation structure across the two doped wells (51, 52) located on each side of the stack. Further, the inter-well shallow trench isolation structure 40 and the at least another dielectric layer (12', 14') completely encapsulates the remaining conductive deep trench fill regions comprising the first conductive deep trench fill subregion 13', the second conductive trench line fill subregion 15', the first modified doping level conductive trench fill region 45, and the third modified doping level conductive trench fill region 35'.

Figure 13A:
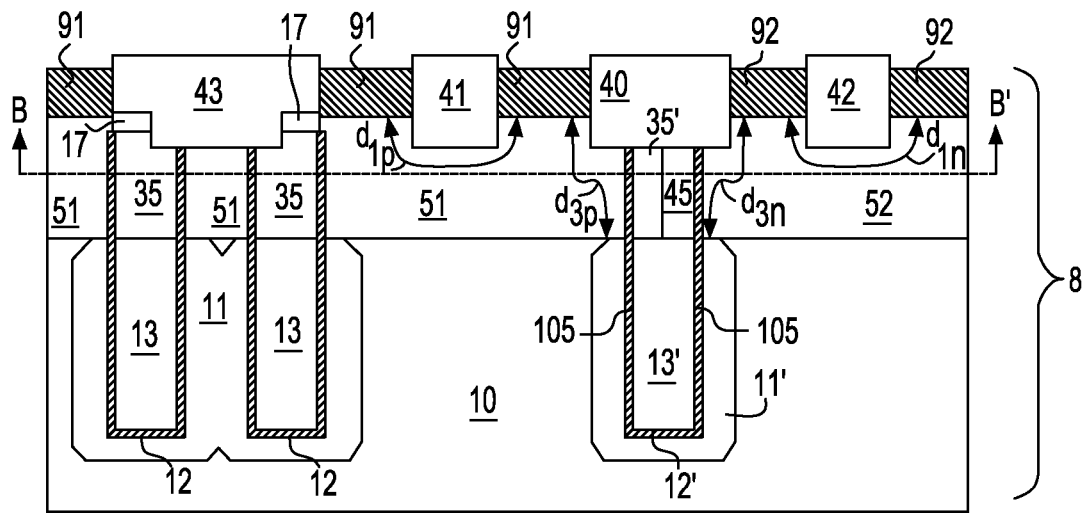
FIG. 13A is a vertical cross-sectional view along the vertical plane A-A' in FIG. 13B of a second exemplary semiconductor structure according to a second embodiment of the present invention.
Figure 13B:
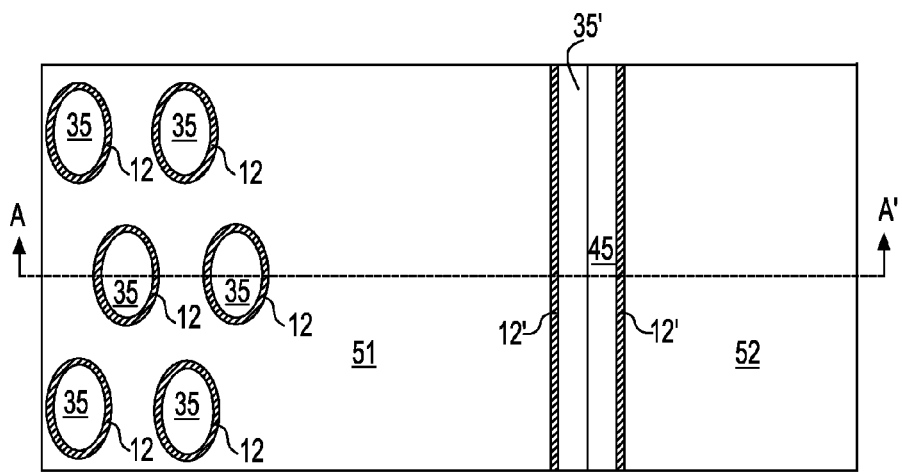
FIG. 13B is a horizontal cross-sectional view along the horizontal plane B-B' in FIG. 13A of the second exemplary semiconductor structure according to the second embodiment of the present invention.

Referring to FIGS. 13A and 13B, a second exemplary structure according to a second embodiment of the present invention comprises an at least another dielectric layer within the at least one deep capacitor trench 3 which consists of a portion of node dielectric layer 12. Other than the differences in the at least another dielectric layer, substantially the same processing steps are employed in the second embodiment as in the first embodiment. Correspondingly, another portion of the at least one dielectric layer formed on the pair of parallel substantially vertical sidewalls 105 consists of another portion of the node dielectric layer 12', which abuts a bottom surface of the inter-well shallow trench isolation structure 40. For example, the node dielectric layer may comprise a nitride layer having a thickness in the range from about 3 nm to about 8 nm. In the second embodiment, the formation of various portions of the trench collar dielectric layer (14, 14') is omitted during the processing steps of the first embodiment. One less step of filling the at least one deep capacitor trench 3 and the deep trench 5 is needed, thus eliminating the step corresponding to formation of the second conductive trench fill subregion 14 and the second conductive deep trench fill subregion 15'. Instead, the first conductive trench fill subregion 12 and the first conductive deep trench fill subregion 13' are extended into the volume of the second conductive trench fill subregion 15 and the second conductive deep trench fill subregion 15', respectively.

The inter-well shallow trench isolation structure 40 and the at least another dielectric layer, which consists only of the another portion of the node dielectric layer 12' in the second embodiment, completely encapsulates the remaining conductive deep trench fill region (13', 35', 45) comprising the first conductive deep trench fill subregion 13', the first modified doping level conductive trench fill region 45, and the third modified doping level conductive trench fill region 35'. Therefore, there is no electrical conductive path from the remaining conductive deep trench fill region (13', 35', 45) to any portion of the semiconductor substrate 8 outside the deep trench 5. However, the third conductive trench fill subregion 17 in each of the at least one deep capacitor trench 3 provides an electrically conductive path between the conductive capacitor trench fill region (13, 35, 17) inside the at least one deep capacitor trench 3 and the semiconductor substrate 8 outside the deep trench 5.

Figure 14:
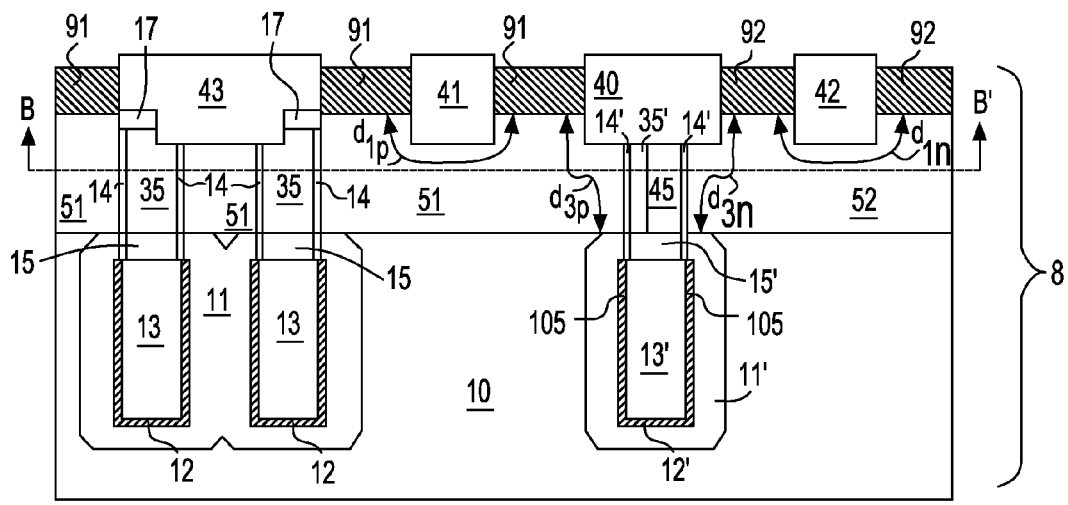
FIG. 14 is a vertical cross-sectional view of a third exemplary semiconductor structure according to a third embodiment of the present invention.

Referring to FIG. 14, a third exemplary structure of the present invention according to a third embodiment of the present invention is shown. The U-shaped buried plate region 11', as described in the first embodiment of the present invention, is not formed in the semiconductor substrate 8 in the third embodiment. This is achieved by employing a block mask during the processing steps of forming the buried plate region 11 either to block the delivery of a doping material onto the pair of parallel substantially vertical semiconductor surfaces 105 of the deep trench 5 or to remove the doping material from the pair of parallel substantially vertical semiconductor surfaces 105 of the deep trench 5. Other than the difference in the presence or absence of a U-shaped buried plate region 11', substantially the same processing steps are employed in the second embodiment as in the first embodiment. Consequently, the third exemplary structure differs from the first exemplary structure only by the absence of a U-shaped buried plate region 11 '. A variant of the third exemplary structure, in which the at least another dielectric layer within the at least one deep capacitor trench 3 consists of a portion of node dielectric layer 12 as in the second exemplary structure, is herein explicitly contemplated.

The pair of parallel substantially vertical sidewalls 105 as described in the first, second and third embodiments of the present invention may adjoin another pair of parallel substantially vertical sidewalls at an angle such that two deep trenches 5 may be adjoined at an angle. Further, multiple deep trenches 5 may be adjoined to form an enclosed semiconductor area contained by multiple adjoining parallel substantially vertical sidewalls 105 having a polygonal cross-sectional area.

Figure 15:
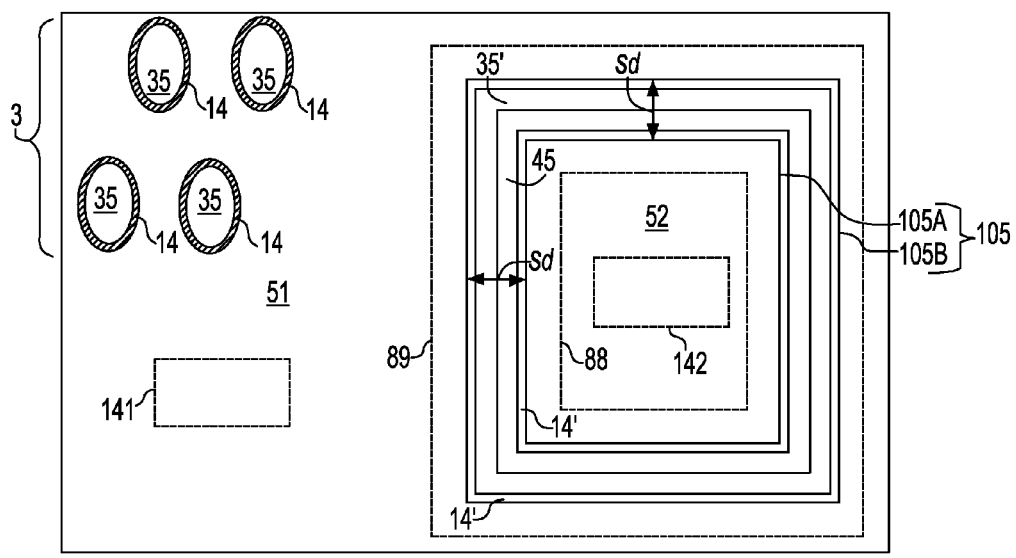
FIGS. 15-19 are horizontal cross-sectional views, at a depth corresponding to the plane A-A' in FIG. 12A, of a fourth through eighth exemplary structure according to a fourth through eighth embodiment of the present invention, respectively.

Referring to FIG. 15, a horizontal cross-sectional view, along a vertical plane corresponding to the height of the view of FIG. 12B, of a fourth exemplary structure according to a fourth embodiment of the present invention shows a set of four pairs of parallel substantially vertical semiconductor surfaces 105 having a constant separation distance sd along a horizontal direction that is perpendicular to a surface normal of each pair of parallel substantially vertical and planar semiconductor surfaces 105. The set of inner substantially vertical semiconductor surfaces 105A are adjoined among one another to form a rectangular shape in the cross-sectional view. The set of outer substantially vertical semiconductor surfaces 105B are adjoined among one another to from another rectangular shape in the cross-sectional view. In other words, the separation distance sd remains constant within each pair of parallel substantially vertical semiconductor surfaces 105. The four pairs of parallel substantially vertical semiconductor surfaces 105 enclose an n-well 52.

The various shallow trench isolation structures (40, 41, 42, 43) are not visible in the horizontal cross-sectional view of FIG. 15 because they are located above the plane of the cross-sectional view. However, their boundaries are schematically represented by various dotted lines to display the overlap of the cross-sectional areas of various components of the structure in FIG. 15. Specifically, the area between an outer edge 89 and the inner edge 88 of the inter-well shallow trench isolation structure 40 includes all of the area between set of the inner substantially vertical semiconductor surfaces 105A and set of outer substantially vertical semiconductor surfaces 105B. This is one aspect of at least one dielectric layer (12', 14') and the inter-well shallow trench isolation structure 40 completely encapsulating the conductive deep trench fill region (13', 35', 45). At least one optional intra-p-well shallow trench isolation structure may be formed within the n-well, which is schematically represented by an optional intra-n-well shallow trench isolation area 142. At least one optional intra-n-well shallow trench isolation structure may be formed within a p-well, which is located outside the volume of the semiconductor substrate 8 occupied by the four pairs of parallel substantially vertical semiconductor surfaces 105. This is schematically represented by an optional intra-p-well shallow trench isolation area 141. Further, at least one deep capacitor trench 3 may be formed in the p-well 51.

Figure 16:
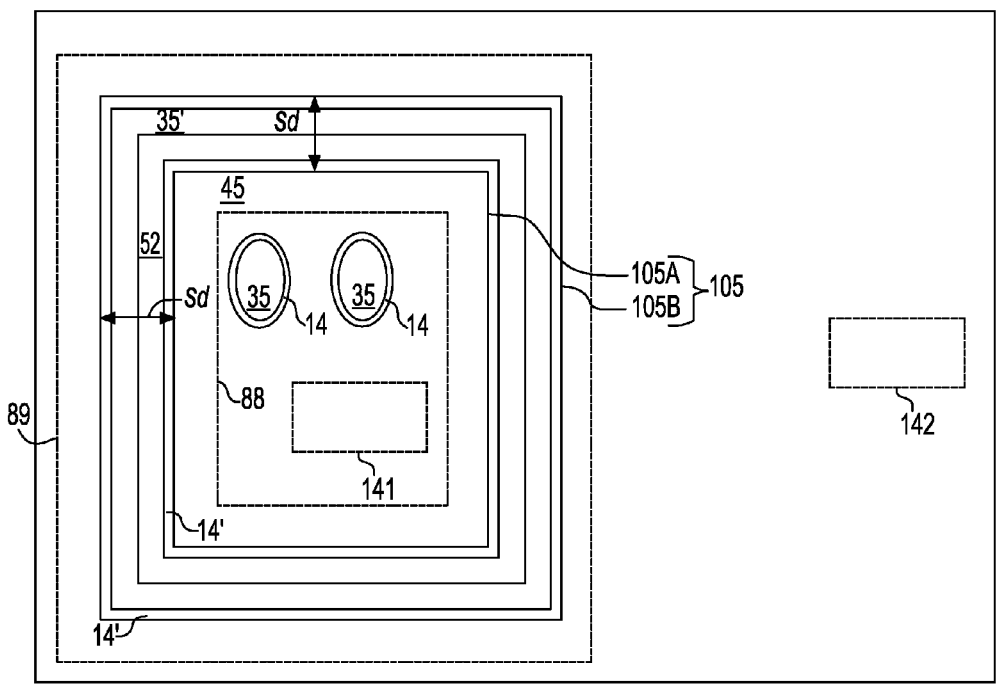

Referring to FIG. 16, a horizontal cross-sectional view, along a vertical plane corresponding to the height of the view of FIG. 12B, of a fifth exemplary structure according to a fifth embodiment of the present invention shows a set of four pairs of parallel substantially vertical semiconductor surfaces 105 enclosing a p-well 51. The set of inner substantially vertical semiconductor surfaces 105A are adjoined among one another to form a rectangular shape in the cross-sectional view. The set of outer substantially vertical semiconductor surfaces 105B are adjoined among one another to from another rectangular shape in the cross-sectional view. As in the fourth exemplary structure, each pair of parallel substantially vertical semiconductor surfaces 105 has a constant separation distance sd along a horizontal direction that is perpendicular to a surface normal of each pair of parallel substantially vertical and planar semiconductor surfaces 105. At least one optional intra-p-well shallow trench isolation structure, at least one optional intra-n-well shallow trench isolation structure, and at least one deep capacitor trench 3 may be formed as in the fourth exemplary structure.

In general, an arbitrary number of pairs of parallel substantially vertical semiconductor surfaces 105 may be adjoined to form a polygonal shape for each of the set of inner substantially vertical semiconductor surfaces 105A and the set of outer substantially vertical semiconductor surfaces 105B. The two polygonal shapes are separated by a constant separation distance sd along a horizontal direction that is perpendicular to a surface normal of each pair of parallel substantially vertical and planar semiconductor surfaces (105A, 105B). While FIGS. 15 and 16 shown the same separation distance sd for all pairs of parallel substantially vertical and planar semiconductor surfaces (105A, 105B), different pairs of parallel substantially vertical and planar semiconductor surfaces (105A, 105B) may have a different distance for the separation distance sd.

The pair of parallel substantially vertical sidewalls 105 may also have a small curvature such that the pair of the parallel substantially vertical sidewalls 105 maintains a constant separation distance sd along the parallel substantially vertical sidewalls (105A, 105B). The radius of curvature is grater than the separation distance sd, and preferably at least an order of magnitude greater than the separation distance. Note that the at least one deep capacitor trench 3 have sidewalls having a radius of curvature on the order of the separation distance at most. Further, the sidewalls the at least one deep capacitor trench 3 do not maintain a constant separation.

Figure 17:
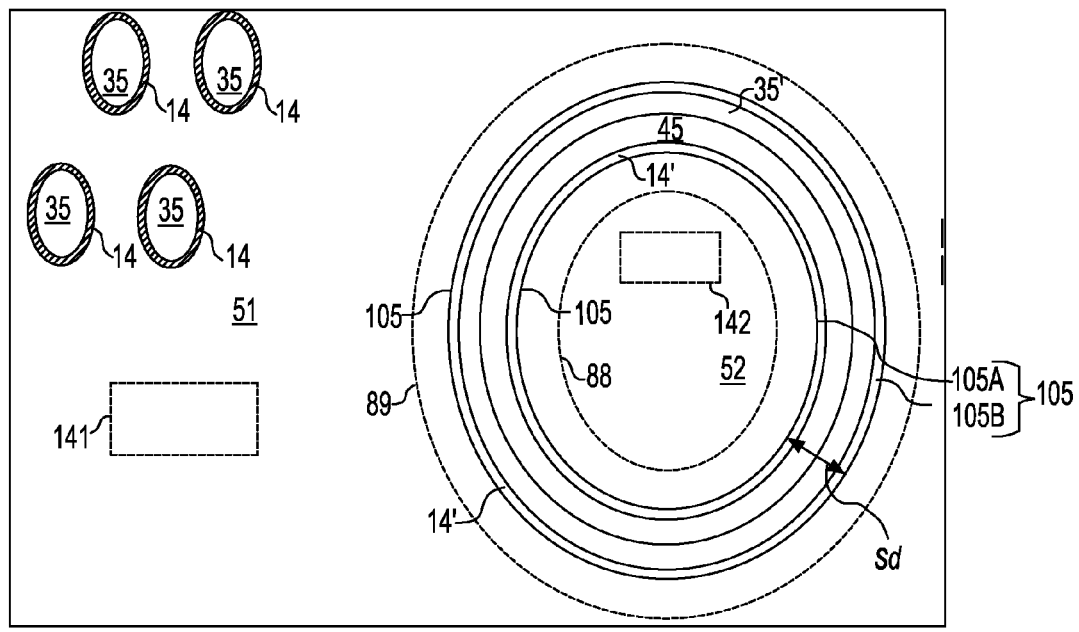

Referring to FIG. 17, a sixth exemplary structure according to the sixth embodiment of the present invention has an inner substantially vertical semiconductor surfaces 105A and an outer substantially vertical semiconductor surfaces 105B, wherein each of the substantially vertical semiconductor surfaces (105A, 105B) has a non-zero curvature but the separation distance sd between the two substantially vertical sidewalls remain constant.

Figure 18:
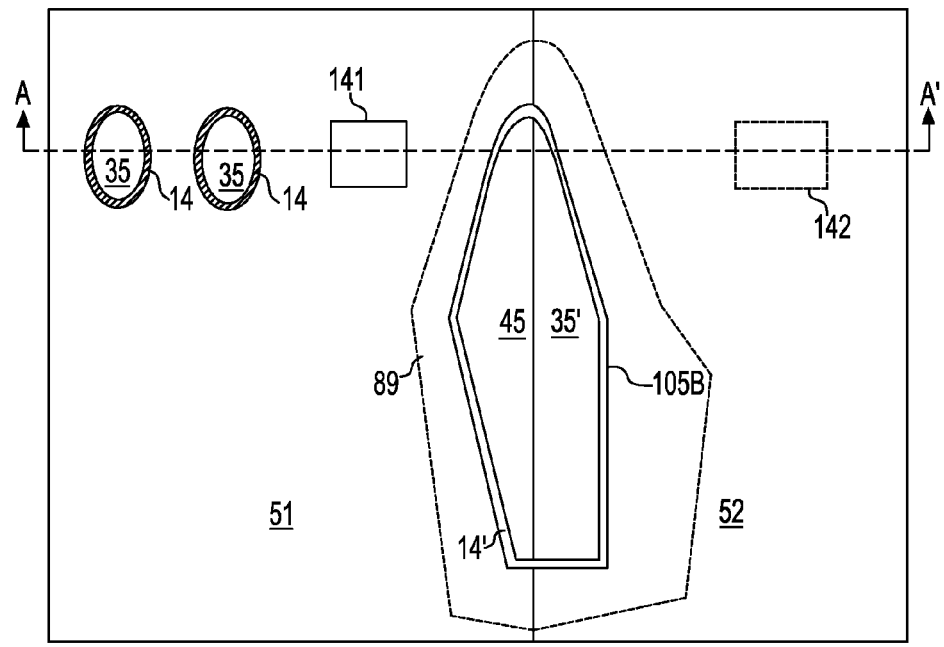

Referring to FIG. 18, a horizontal cross-sectional view of a seventh exemplary structure, along a vertical plane corresponding to the height of the view of FIG. 12B, according to a seventh embodiment of the present invention is shown. A deep trench containing a set of outer substantially vertical sidewalls 105B and having substantially the same depth as the at least one deep capacitor trench 3 as described above is formed either alone or with at least one deep capacitor trench 3. Consequently, the depth of the deep trench is in the range from about 2 micron to about 8 micron. As in the previous embodiments, at least one dielectric layer (12', 14') comprises at lest one dielectric material. A vertical cross-sectional view along the plane A-A' in FIG. 18 is substantially the same as the vertical cross-sectional view in FIG. 12A. Since no inner substantially vertical is present in this embodiment, the at least one dielectric layer (12', 14') is located directly on the set of outer substantially vertical sidewalls 105B. A conductive fill region (13', 35', 45) as described in the previous embodiments are formed within the at least one dielectric layer (12', 14'). An inter-well shallow trench isolation structure 40 abuts the at least one dielectric layer (12', 14'). The at least one dielectric layer (12', 14') and the inter-well shallow trench isolation structure 40 completely encapsulates the conductive deep trench fill region (13', 35', 45).

The various shallow trench isolation structures (40, 41, 42, 43) are not visible in the horizontal cross-sectional view of FIG. 18 because they are located above the plane of the cross-sectional view. However, their boundaries are schematically represented by various dotted lines to display the overlap of the cross-sectional areas of various components of the structure in FIG. 18. Specifically, the area of an inter-well shallow trench isolation structure 40 is represented by the area enclosed by an outer edge 89 of the inter-well shallow trench isolation structure 40. The conductive deep trench fill region comprises a first conductive deep trench fill subregion 13', a first modified doping level conductive trench fill region 45, and a third modified doping level conductive trench fill region 35' as described in previous embodiments. The area of an inter-well shallow trench isolation structure 40 includes all of the area within the set of outer substantially vertical semiconductor surfaces 105B, which includes all of the cross-sectional area of the conductive deep trench fill region, represented as the union of the areas of the first modified doping level conductive trench fill region 45 and the third modified doping level conductive trench fill region 35' in FIG. 18. This is one aspect of at least one dielectric layer (12', 14') and the inter-well shallow trench isolation structure 40 completely encapsulating the conductive deep trench fill region (13', 35', 45).

The set of outer substantially vertical sidewalls 105B has a closed shape in a horizontal cross-section of the semiconductor structure across the deep trench. The closed shaped may comprise a curved portion and/or a polygonal portion. The conductive deep trench fill region (13', 35', 45) may have a solid form without a void, i.e., topologically homeomorphic to a sphere.

Figure 19:
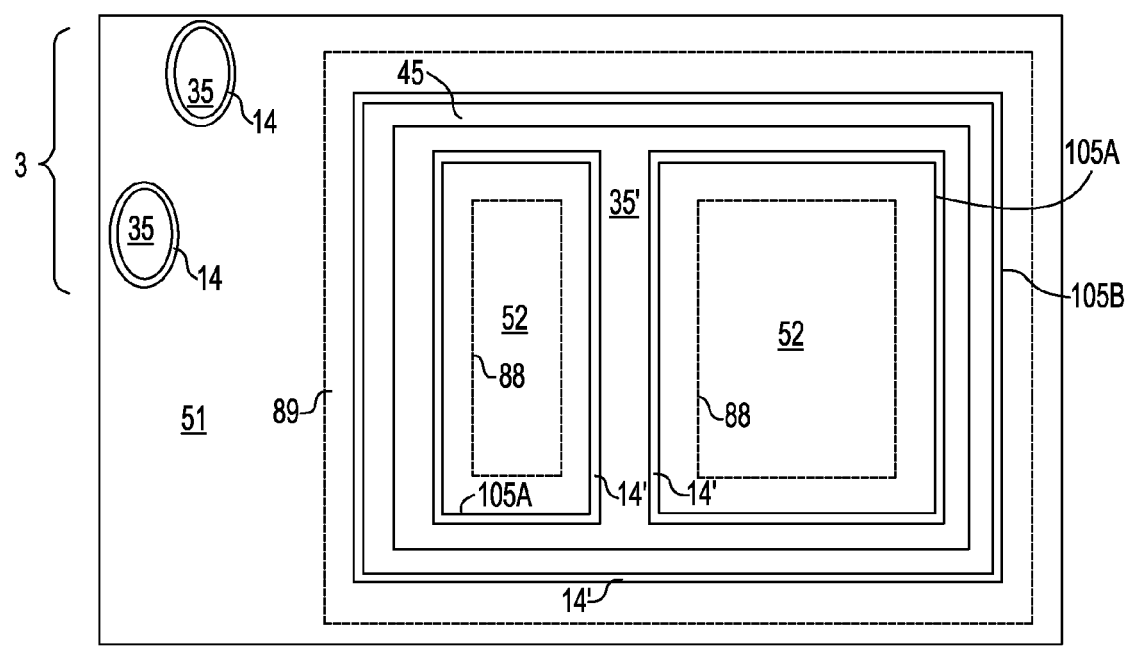

Referring to FIG. 19, a horizontal cross-sectional view of an eighth exemplary structure, along a vertical plane corresponding to the height of the view of FIG. 12B, according to an eighth embodiment of the present invention is shown. A deep trench contains a set of outer substantially vertical sidewalls 105B and at least one set of inner substantially vertical sidewalls 105A, for example, two sets of inner substantially vertical sidewalls 105A as in FIG. 19. The deep trench has substantially the same depth as the at least one deep capacitor trench 3 as described above is formed either alone or with at least one deep capacitor trench 3. Consequently, the depth of the deep trench is in the range from about 2 micron to about 8 micron. As in the previous embodiments, at least one dielectric layer (12', 14') comprises at lest one dielectric material. The at least one dielectric layer (12', 14') is located directly on the set of outer substantially vertical sidewalls 105B and the at least one set of inner substantially vertical sidewalls 105A. A conductive fill region (13', 35', 45) as described in the previous embodiments are formed within the at least one dielectric layer (12', 14') and between the set of outer substantially vertical sidewalls 105B and the at least one set of inner substantially vertical sidewalls 105A. An inter-well shallow trench isolation structure 40 abuts the at least one dielectric layer (12', 14'). The at least one dielectric layer (12', 14') and the inter-well shallow trench isolation structure 40 completely encapsulates the conductive deep trench fill region (13', 35', 45).

The various shallow trench isolation structures (40, 41, 42, 43) are not visible in the horizontal cross-sectional view of FIG. 19. Their boundaries are schematically represented by various dotted shapes to display the overlap of the cross-sectional areas of various components of the structure in FIG. 19. Specifically, the area of an inter-well shallow trench isolation structure 40 is represented by the area enclosed between an outer edge 89 of the inter-well shallow trench isolation structure 40 and at least one inner edge 88 of the inter-well shallow trench isolation structure 40. The conductive deep trench fill region comprises a first conductive deep trench fill subregion 13', a first modified doping level conductive trench fill region 45, and a third modified doping level conductive trench fill region 35' as described in previous embodiments. The area of an inter-well shallow trench isolation structure 40 includes all of the area between the set of outer substantially vertical semiconductor surfaces 105B and the at least one set of inner substantially vertical semiconductor surfaces 105A, which includes all of the cross-sectional area of the conductive deep trench fill region, represented as the union of the areas of the first modified doping level conductive trench fill region 45 and the third modified doping level conductive trench fill region 35' in FIG. 19. This is one aspect of at least one dielectric layer (12', 14') and the inter-well shallow trench isolation structure 40 completely encapsulating the conductive deep trench fill region (13', 35', 45).

Each of the set of outer substantially vertical sidewalls 105B and the at least one set of inner substantially vertical sidewalls 105A has a closed shape in a horizontal cross-section of the semiconductor structure across the deep trench. The closed shaped may comprise a curved portion and/or a polygonal portion. The conductive deep trench fill region (13', 35', 45) has a void around each of the at least one set of inner substantially vertical sidewalls, i.e., topologically has as many number of handles as the number of the at least one set. Each of the at least one set of inner substantially vertical sidewalls 105A forms a void in the conductive deep trench fill region (13', 35', 45), which is a topological "handle" that forms a discontinuity within a solid three dimensional object. If the number of void, or the handle, is one, the conductive deep trench fill region (13', 35', 45) is topologically homeomorphic to a torus, i.e., may be stretched into a torus by continuous bending. Multiple voids, or handles, may be formed in the conductive deep trench fill region (13', 35', 45).

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a deep trench containing a pair of parallel substantially vertical sidewalls located in a semiconductor substrate;
at least one dielectric layer comprising at least one dielectric material located directly on said pair of parallel substantially vertical sidewalls;
a shallow trench isolation structure contacting said at least one dielectric layer;
a conductive deep trench fill region comprising at least one conductive trench fill material, wherein said at least one dielectric layer and said shallow trench isolation structure completely encapsulate said conductive deep trench fill region;
a p-well directly contacting one of said pair of parallel substantially vertical sidewalls and said shallow trench isolation structure; and
an n-well directly contacting the other of said pair of parallel substantially vertical sidewalls and said shallow trench isolation structure and disjoined from said p-well.

2. The semiconductor structure of claim 1, further comprising at least one trench capacitor, each of said at least one trench capacitor comprising:
a deep capacitor trench having a substantially elliptical horizontal cross-sectional area located in said semiconductor substrate;
a buried plate region located directly on said deep capacitor trench;
another at least one dielectric layer comprising said at least one dielectric material located directly on said deep capacitor trench; and
a conductive capacitor trench fill material region comprising said at least one conductive trench fill material, wherein an electrically conductive path is present between said another conductive trench fill material region and a portion of said semiconductor substrate outside said deep capacitor trench.

3. The semiconductor structure of claim 2, wherein said buried plate region has a doping concentration from about $3.0 \times 10^{18}/cm^3$ to about $1.0 \times 10^{20}/cm^3$, and is confined between a first depth and a second depth, said first depth is from about 2 micron to about 9 micron, and said second depth is from about 0.5 micron to about 2 micron.

4. The semiconductor structure of claim 3, further comprising a U-shaped buried plate region located directly on said deep trench, wherein said U-shaped buried plate region has substantially the same doping concentration as said at least one buried plate region, and is confined between said first depth and said second depth.

5. The semiconductor structure of claim 1, further comprising:
at least one heavily n-doped region contacting said p-well, a top surface of said semiconductor substrate, and one side of said shallow trench isolation structure; and
at least one heavily p-doped region contacting said n-well, said top surface, and the other of said shallow trench isolation structure, wherein each of said at least one heavily n-doped region and said at least one heavily p-doped region has a dopant concentration from about $5.0 \times 10^{19}$ atoms/cm$^3$ to about $5.0 \times 10^{21}$ atoms/cm$^3$.

6. The semiconductor structure of claim 1, further comprising:
at least one first intra-well shallow trench isolation structure located within said p-well; and
at least one second intra-well shallow trench isolation structure located within said n-well, wherein said shallow trench isolation structure, said at least one first intra-well shallow trench isolation structure, and said at least one second intra-well shallow trench isolation structure comprise the same dielectric material and have a bottom surface located at the same depth from a top surface of said semiconductor substrate.

7. The semiconductor structure of claim 1, further comprising at least one trench capacitor, each of said at least one trench capacitor comprising:
a deep capacitor trench having a substantially elliptical horizontal cross-sectional area located in said semiconductor substrate;
a buried plate region located directly on said deep capacitor trench;
another at least one dielectric layer comprising said dielectric material located directly on said deep capacitor trench; and
another conductive trench fill material region comprising said at least one conductive trench fill material, wherein an electrically conductive path is present between said another conductive trench fill material region and a portion of said semiconductor substrate outside said deep capacitor trench.

8. The semiconductor structure of claim 1, wherein said pair of parallel substantially vertical sidewalls has a constant separation distance along a horizontal direction that is perpendicular to a surface normal of said pair of parallel substantially vertical sidewalls.

9. The semiconductor structure of claim 1, wherein said at least one dielectric layer consists of:
a node dielectric layer comprising a node dielectric material; and
a trench collar dielectric layer comprising a trench collar dielectric material, wherein said trench collar dielectric layer abuts said shallow trench isolation structure.

* * * * *